United States Patent [19]
Kugai et al.

[11] Patent Number: 5,548,262
[45] Date of Patent: Aug. 20, 1996

[54] FLUX TRANSFORMER FORMED OF AN OXIDE SUPERCONDUCTING THIN FILM AND METHOD FOR MANUFACTURING THE SAME

[75] Inventors: Hirokazu Kugai; Tatsuoki Nagaishi, both of Hyogo, Japan

[73] Assignee: Sumitomo Electric Industries, Ltd., Osaka, Japan

[21] Appl. No.: 412,906

[22] Filed: Mar. 29, 1995

[30] Foreign Application Priority Data

Mar. 29, 1994 [JP] Japan .................................. 6-082404
Feb. 10, 1995 [JP] Japan .................................. 7-046376

[51] Int. Cl.$^6$ .............................. H01F 7/22; H01L 39/24; G01R 33/035
[52] U.S. Cl. ..................... 335/216; 324/248; 505/162; 505/220; 505/705
[58] Field of Search ...................... 335/216; 336/DIG. 1; 324/248; 29/599, 602.1; 505/162, 220, 705, 706, 741, 845, 846, 879, 880

[56] References Cited

PUBLICATIONS

Oh, et al., "Multilevel YbaCuO flux transformers with high $T_c$ SQUIDs: A prototype high $T_c$ SQUID magnetometer working at 77 K", Appl. Phys. Lett. 59(1), 1 Jul. 1991, pp. 123–125.

Miklich, et al., "Sensitive $YBa_2Cu_3O_{7-x}$ thin–film magnetometer", Appl. Phys. Lett. 59(8), 19 Aug. 1991, pp. 988–990.

Welistood, et al., "Superconducting thin–firm multiturn coils of $YBa_2Cu_3O_{7-x}$", Appl. Phys. Lett. 56(23), 4 Jun. 1990, pp. 2336–2338.

Husemann, et al. "Spatially resolved electrical characterization of a $YBa_2CU_3O_{7-\delta}$flux", Appl. Phys. Lett. 62(22), 31 May 1993, pp. 2871–2873.

*Primary Examiner*—Leo P. Picard
*Assistant Examiner*—Ramon M. Barrera
*Attorney, Agent, or Firm*—Foley & Lardner

[57] ABSTRACT

A flux transformer comprises a pickup coil 1, an input coil 2 and a pair of lines 3, 4. The line 4 contains a bridge part 4a intersecting the input coil 2. The pickup coil 1, input coil 2 and a pair of lines 3, 4 are formed of a first and a second oxide superconducting thin films 11, 13. Furthermore, the flux transformer comprises a non-superconducting thin film 12. The non-superconducting thin film 12 is disposed between the first and the second oxide superconducting thin films 11, 13 and is located in a domain wherein the line 4 intersects the input coil 2. A pattern of the first oxide superconducting thin film 11 corresponds to the pickup coil 1, the input coil 2 and the lines 3,4 except the bridge part 4a. The pattern of the second oxide superconducting thin film 13 corresponds to the input coil 2 except the domain where the non-superconducting thin film exits, the pickup coil 1 and the lines 3,4. Except in the domain where the non-superconducting thin film 12 exists, the second oxide superconducting thin film 13 are piled up directly atop the first oxide superconducting thin film 11 in all domains.

7 Claims, 6 Drawing Sheets

FLUX TRANSFORMER FORMED OF AN OXIDE SUPERCONDUCTING THIN FILM AND METHOD FOR MANUFACTURING THE SAME

BACKGROUND OF THE INVENTION

1. Field of the Invention

The present invention relates to a flux transformer. More specifically, the present invention relates to a new construction of a flux transformer formed of an oxide superconducting thin film and a method for manufacturing the same.

2. Description of the Related Art

A SQUID (Superconducting Quantum Interference Device) is a device employing special characteristics of superconducting materials. A SQUID is formed with a superconducting loop containing a weak junction and can be used as a magnetic flux sensor with high sensitivity. In many cases, a SQUID is used together with a flux transformer. When a SQUID is used with a flux transformer, the sensitivity of a magnetic flux sensor may be increased and the choice for arranging the physical layout are increased.

A flux transformer comprises a pair of coils and these coils are connected with a pair of lines. Generally, these coils and lines are formed of a superconducting material in a form of, for example, superconducting thin film.

In this kind of a flux transformer, one of the coils has several turns. Accordingly, it is unavoidable that one of the lines intersects the coil having several turns. The line that intersects the coil is called a bridge part. Furthermore, a non-superconducting thin film is inserted between the bridge part and the coil so that both of them are insulated from each other.

One of the methods for producing a flux transformer formed of an oxide superconducting thin film is described on pp. 123–125 of "Applied Physics Letters 59(1), 1 Jul. 1991". This method is described below.

At first, an oxide superconducting thin film is deposited on a substrate and patterned to have a pattern of a first superconducting thin film. Namely, the pattern of the first oxide superconducting thin film corresponds to the lines except the bridge part, the pickup coil and the input coil. Successively, a non-superconducting thin film is deposited on the surface of the first oxide superconducting thin film and the substrate and a part of the non-superconducting thin film is removed. As a result, one end of the input coil and one end of the pickup coil appear forward. Finally, a second oxide superconducting thin film is deposited. The second oxide superconducting thin film is patterned to be a bridge part.

Another method for producing a flux transformer having substantially the same construction is described on pp. 988–990 of "Applied Physics Letters 59(8), 19 Aug. 1991". In this method, only the bridge part formed of an oxide superconducting thin film is patterned on the substrate at first. Successively, a non-superconducting thin film is formed on the substrate and the first oxide superconducting thin film, and two parts of the non-superconducting thin film are removed at both ends of the first superconducting thin film. Finally, the second superconducting thin film is deposited and patterned to form a remaining pattern of the flux transformer on the non-superconducting thin film.

Still another method for manufacturing the magnetic flux transformer is described on pp. 2336–2338 of "Applied Physics Letters 56(23), 4 Jun. 1990" and on pp. 2871–2873 of "Applied Physics Letters 62(22), 31 May 1993". In this method, a superconducting thin film is patterned by using masks made of a metal or a silicon.

The methods described above have the following problems.

Concerning the first method, the quality of the first superconducting thin film that was deposited is apt to be low in the completed flux transformer. Because the first superconducting thin film is often damaged during the deposition of the non-superconducting thin film and the second superconducting thin film.

Concerning the second method, the quality of the second superconducting thin film that was deposited is apt to be low. The reason. is that the quality of the support layer influences the quality of the second oxide superconducting thin film. However, it is difficult to uniformly deposit a non-superconducting thin film having high quality on the entire surface of the substrate. Accordingly, it is difficult to deposit an oxide superconducting thin film having high quality on a non-superconducting thin film not having high quality.

Furthermore, concerning the third method using a metal mask or silicon mask for patterning, the problem is that processing precision at patterning is low. Using this method, the accuracy is at best only 20 µm degree.

SUMMARY OF THE INVENTION

An object of the present invention is to provide a new flux transformer formed of an oxide superconducting thin film. Another object of the present invention is to provide a method for manufacturing this new flux transformer.

The flux transformer of the present invention comprises a pair of superconducting thin films and a non-superconducting thin film deposited between the superconducting thin films. In all other domains except a domain in which the non-superconducting thin film exists, the superconducting thin films are piled up one directly atop the other. This fact is an important characteristic of the present invention.

The flux transformer of the present invention comprises a pair of coils and a pair of lines. The coils include a pickup coil and an input coil. These coils are connected by the lines which include the first and the second line. At the place where the second line intersects the input coil, the second line forms a bridge part.

In this flux transformer, the coils and the lines are formed of the first and the second oxide superconducting thin film. The first oxide superconducting thin film has a pattern corresponding to the second line except the bridge part, the first line, the pickup coil and the input coil. The second oxide superconducting thin film has a pattern corresponding to the pickup coil, the input coil, the first line and the second line. But, in a domain where the bridge part intersects the input coil, a part of the input coil is removed from the pattern of the second oxide superconducting thin film. Non-superconducting thin film exists between a part of the input coil included in the first oxide superconducting thin film and the bridge part included in the second oxide superconducting thin film.

Furthermore, the present invention provides a method for producing the superconducting flux transformer mentioned above. This manufacturing method contains the first, the second and the third production process as below. During the first production process, the first oxide superconducting thin film is deposited on a substrate and is patterned to have a specific pattern. During the second production process, the non-superconducting thin film is deposited and patterned to have a specific pattern. During the third production process, the second oxide superconducting thin film is deposited on the first oxide superconducting thin film, the non-superconducting thin film and the substrate is patterned to have another specific pattern.

In another mode of the method according to the present invention, the fabrication of the second oxide superconducting thin film, the fabrication of non-superconducting thin film and the fabrication of the first oxide superconducting thin film are done successively in this order.

In any mode of the present invention, the surface layer of the lower oxide superconducting thin film is preferably removed slightly just before the fabrication of the upper oxide superconducting thin film.

Furthermore, the heat-treatment so called "annealing" is conducted for improving the quality of the oxide superconducting thin films by heating them in an oxygen atmosphere after the upper oxide superconducting thin film has been deposited. As a result of this treatment, each oxide superconducting thin film is supplemented with oxygen.

An important characteristic of the flux transformer of the present invention is that the first and the second oxide superconducting thin films are piled up, one directly atop the other, except in a domain where the oxide superconducting thin films are insulated by the non-superconducting thin film. In other words, the upper and the lower oxide superconducting thin films have same pattern except the domain where the non-superconducting thin film exists.

In this flux transformer, the lower oxide superconducting thin film is deposited on the substrate as a support layer and the lower oxide superconducting thin film is a support layer to the upper oxide superconducting thin film in greater domain. Accordingly, the quality of the upper oxide superconducting thin film becomes high. When this action is considered, the first and the second oxide superconducting thin film should have the same composition and the same crystal structure.

On the other hand, the support layer of the deposition of the non-superconducting thin film is the substrate or the lower oxide superconducting thin film. Accordingly, it is preferable that the non-superconducting thin film is made of same material as the material of the substrate.

In the above methods according to the present invention, all of the thin films are able to be patterned by a photolithography technology. Accordingly, all the thin films can be formed a minute pattern precisely to less than 20 μm.

Furthermore, it is preferable that the surface layer of the lower oxide superconducting thin film is removed slightly just before the upper oxide superconducting thin film is deposited. For the production process mentioned above, the lower oxide superconducting thin film is made thick to compensate for the thickness to be removed.

Additional objects and advantages if the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate the preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

Figure 1:
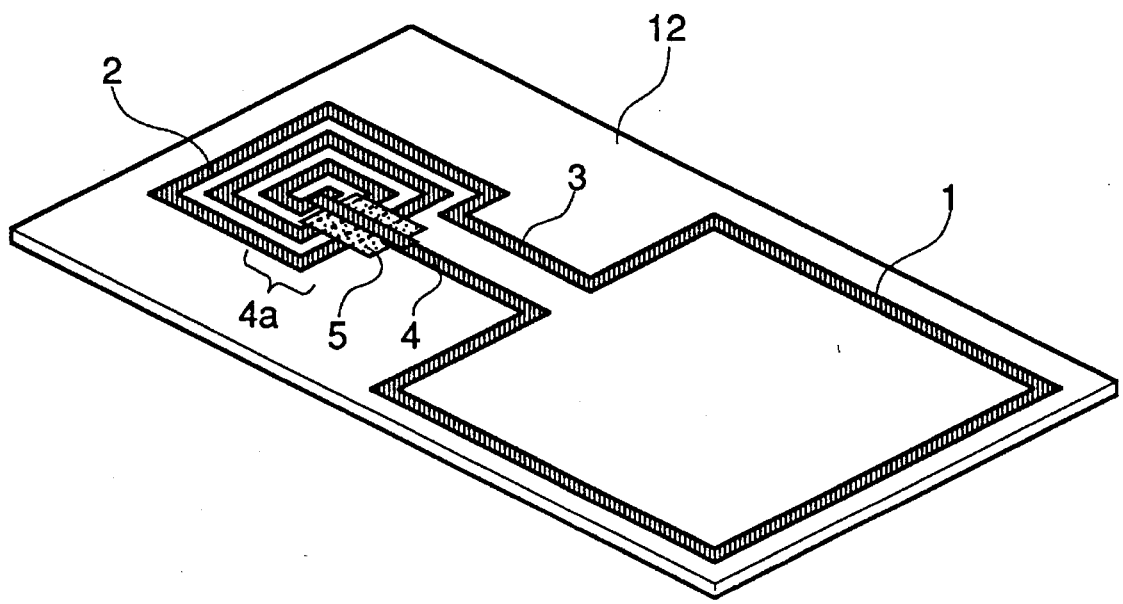
FIG. 1 is a perspective view showing typical construction of a flux transformer.

The general construction of a flux transformer is shown in FIG. 1. As shown in the FIG. 1, the flux transformer comprises the pickup coil 1 and the input coil 2. At the same time, the flux transformer comprises the pair of line 3, 4 that connect the coils to each other. These elements are formed of an oxide superconducting thin film. Furthermore, a non-superconducting thin film is shown in the domain where the input coil 2 intersects the line 4. In this domain, the line 4 is designated as a bridge part 4a.

Each process of the method for manufacturing the oxide superconducting flux transformer of the prior art is successively mentioned in the FIG. 2.

Figure 2A:
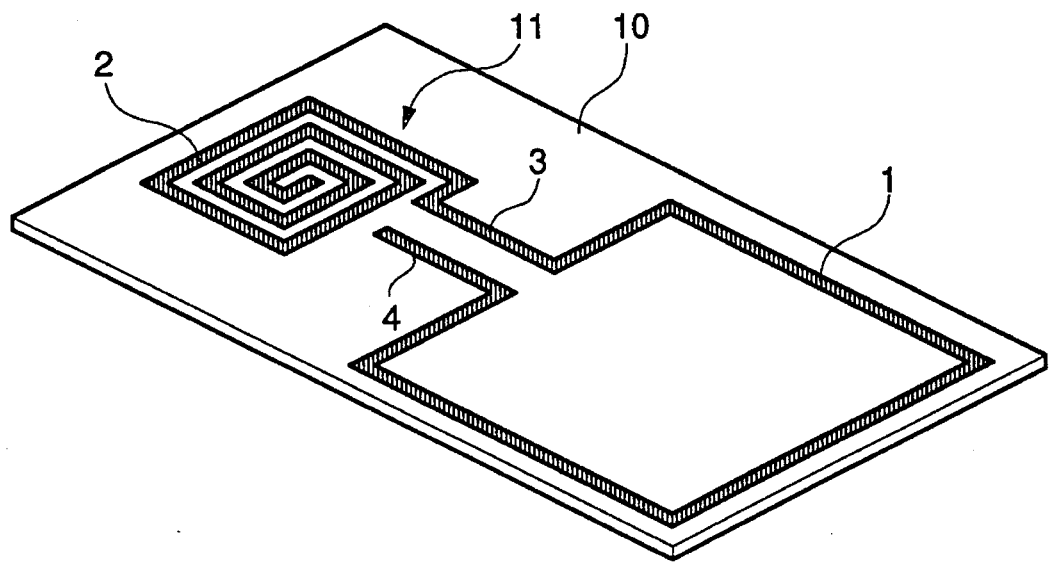
FIGS. 2A to 2D illustrate each step of the prior art for manufacturing a flux transformer formed of an oxide superconducting thin film.
Figure 2B:
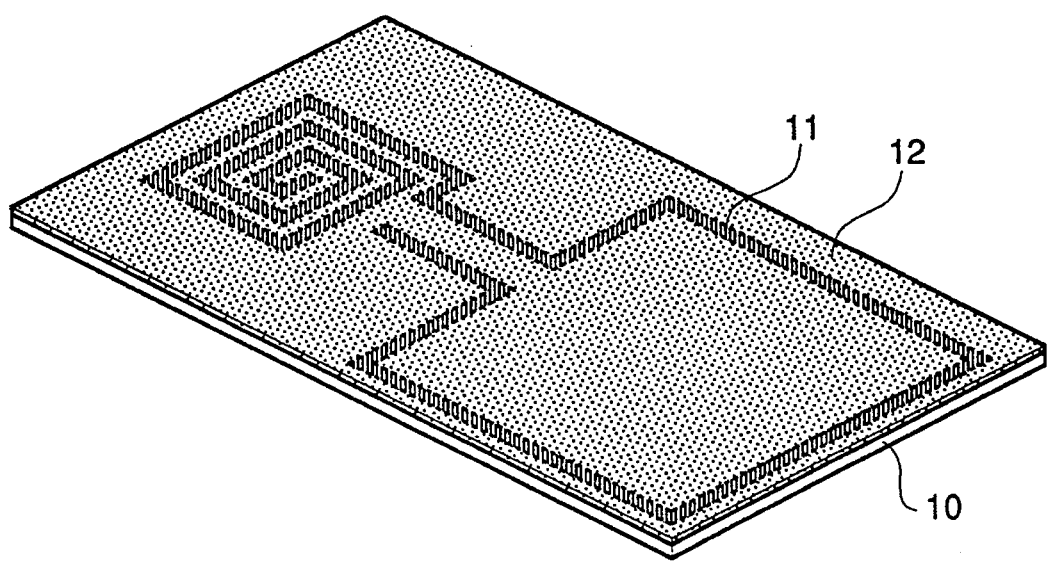
Figure 2C:
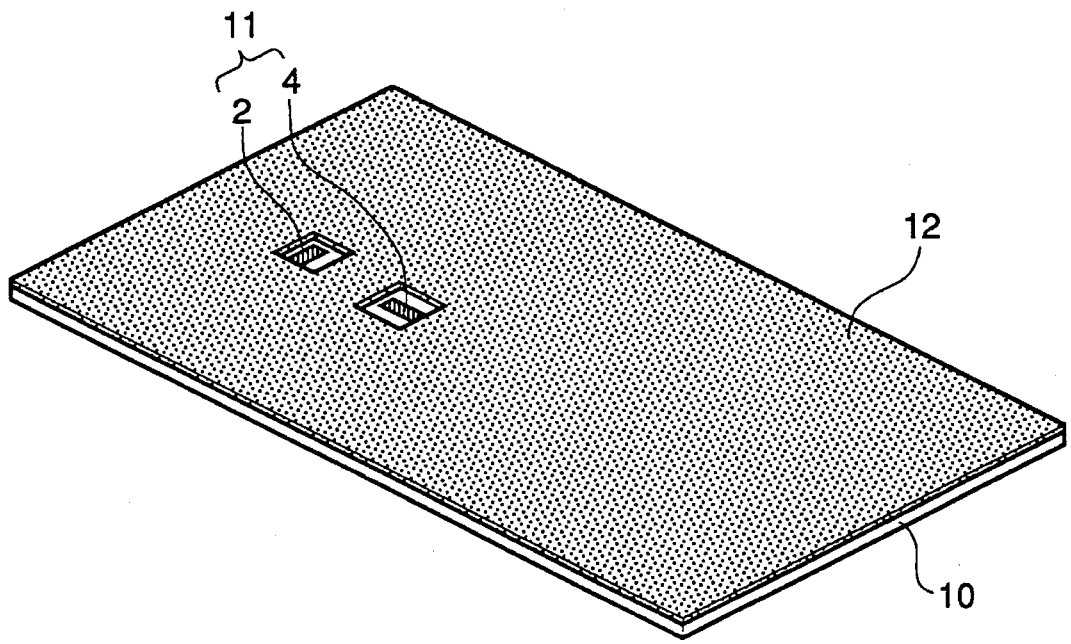
Figure 2D:
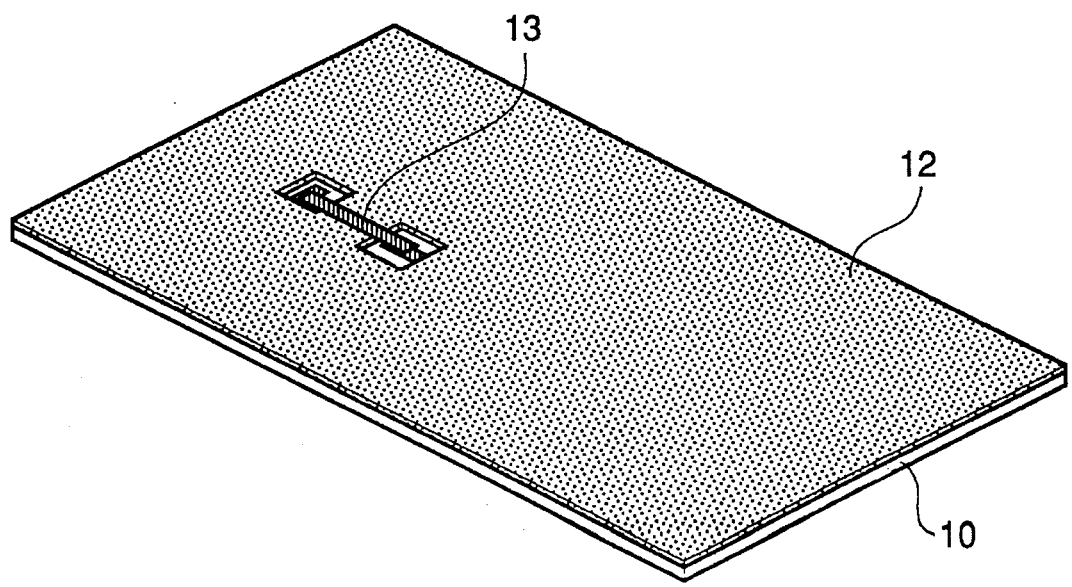

At first, an oxide superconducting thin film is deposited on a substrate 10 and patterned to be the first superconducting thin film. As a result, the first oxide superconducting thin film 11 that has a pattern shown in the FIG. 2A is formed. The serial pattern of the first oxide superconducting thin film 11 corresponds to the pickup coil 1, the input coil 2, the line 3 and the line 4 except the bridge part. Subsequently, a non-superconducting thin film 12 is deposited as shown in FIG. 2B. A part of the non-superconducting thin film 12 is removed as shown in FIG. 2C so that a pair of apertures is formed. One end of the input coil 2 and one end of the line 4 appear in these apertures. Finally, the second oxide superconducting thin film 13 forming a bridge part 4a is formed as shown in FIG. 2D.

Figure 3A:
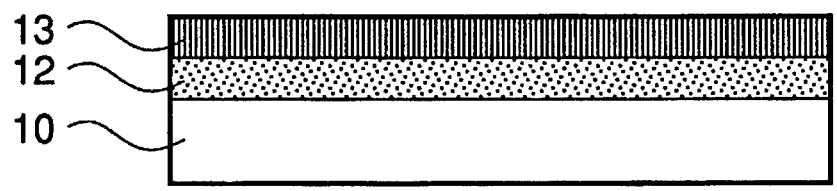
FIGS. 3A to 3C are sectional views showing the layer construction of a flux transformer formed of an oxide superconducting thin film.
Figure 3B:
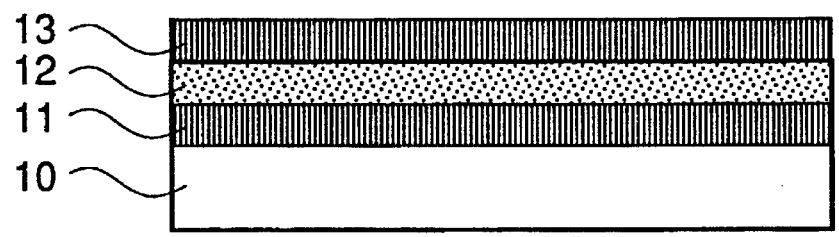
Figure 3C:
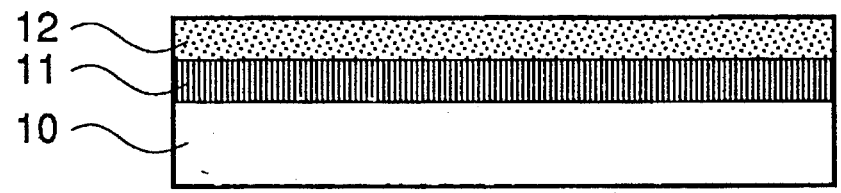

The flux transformer mentioned above contains three kinds of layers constructed as shown in FIGS. 3A–3C. The layer construction of a domain containing the bridge part 4a is shown in either FIG. 3A or FIG. 3B. In the first layer construction shown in FIG. 3A, the substrate 10, the non-superconducting thin film 12 and the oxide superconducting thin film 13 are piled up successively in this order from the bottom. In the second layer construction shown in FIG. 3B, the substrate 10, the oxide superconducting thin film 11, the non-superconducting thin film 12 and the oxide superconducting thin film 13 are piled up successively in this order from the bottom. The layer construction of a domain containing the pickup coil 1 or the input coil 2 is shown in FIG. 3C. In the third layer construction shown in FIG. 3C, the substrate 10, the oxide superconducting thin film 11 and the non-superconducting thin film 12 are piled up successively in this order from the bottom. In the portion of this domain which overlaps the domain containing the bridge part, the first layer construction shown in FIG. 3A is also formed.

In the flux transformer produced by the method shown in the FIG. 2, the layer construction shown in FIG. 3C is formed in the greater part of the flux transformer. Accordingly, it is unavoidable to deteriorate the quality of the lower superconducting thin film including the pickup coil and the input coil.

On the other hand, in case that the flux transformer is produced by the method that the bridge part is formed by the lower superconducting thin film at first, the layer construction shown in FIG. 3A is formed in the greater part. Accordingly, it is difficult to uniformly deposit the upper superconducting thin film including the pickup coil and the input coil in high quality.

Furthermore, in case that the flux transformer is produced by the method using a metal mask or silicon mask for patterning, the accuracy of the pattern is only 20 μm degree at the best.

The method for manufacturing the flux transformer of the present invention is shown in FIG. 4.

Figure 4A:
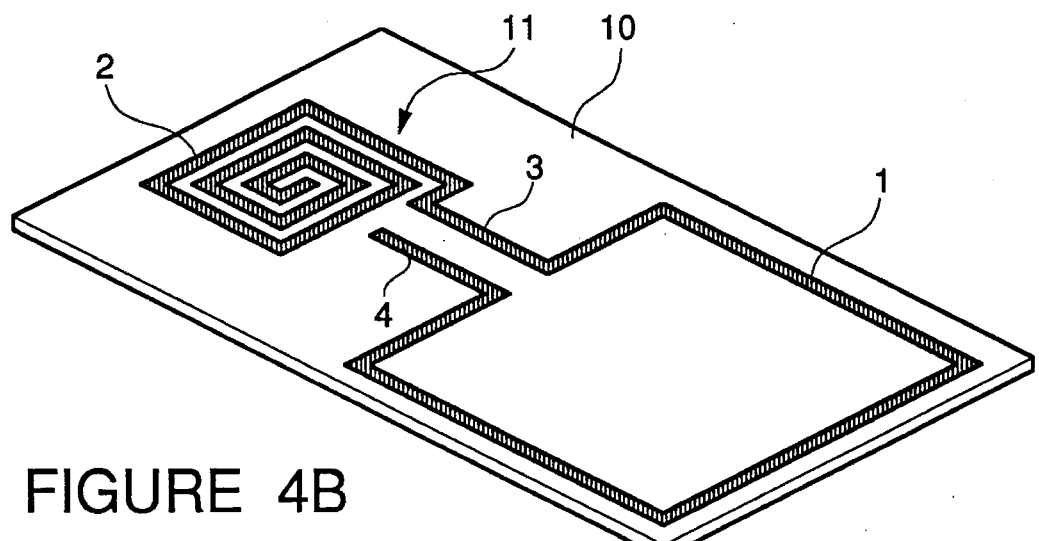
FIGS. 4A to 4C are perspective views showing each step of the method for manufacturing a flux transformer of the present invention.
Figure 4B:
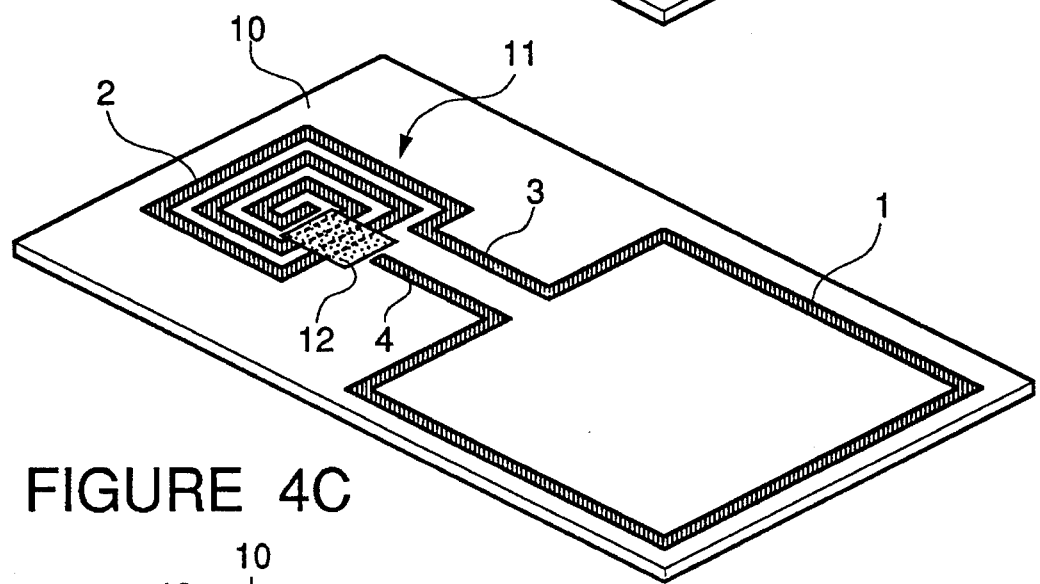

At first, as shown in FIG. 4A, an oxide superconducting thin film is deposited on a substrate 10 and patterned to have the pattern of the flux transformer except for the bridge part 4a.

Subsequently, the non-superconducting thin film 12 is deposited on the entire surface of the substrate 10 and then removed except in the domain where the line 4 intersect the input coil 2.

Figure 5:
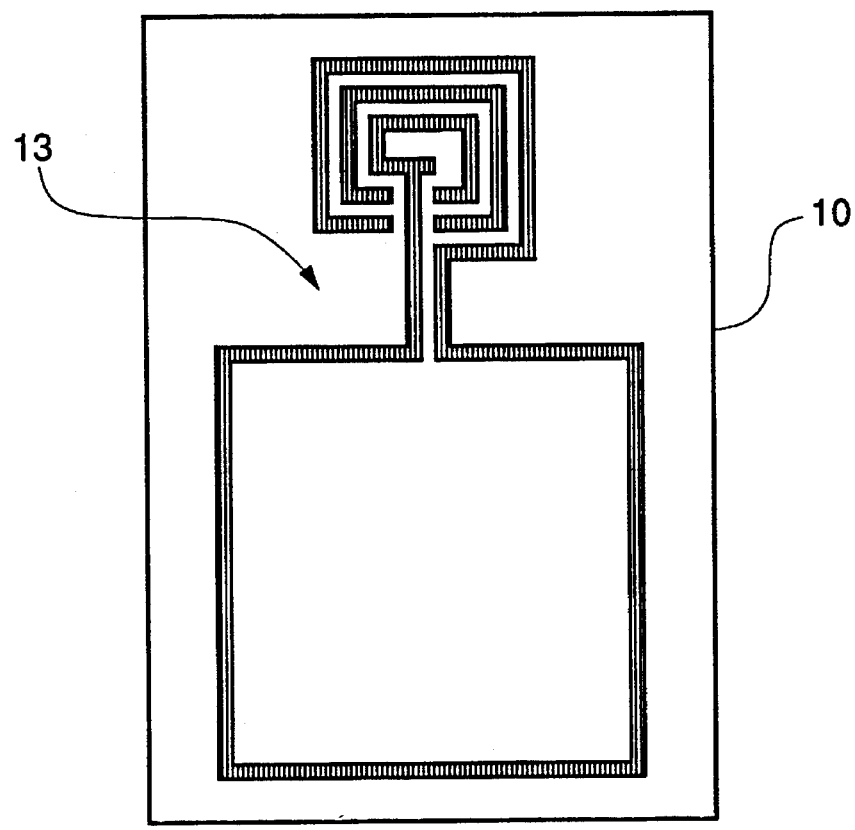
FIG. 5 is a plane side showing a pattern of the second oxide superconducting thin film alone.

Subsequently, the second oxide superconducting thin film is deposited and patterned to have a pattern as shown in FIG. 5.

Preferably, just before the process mentioned in the preceding paragraph is carried out, the surface layer of the first oxide superconducting thin film 11 is removed slightly, by ion milling for example.

Figure 4C:
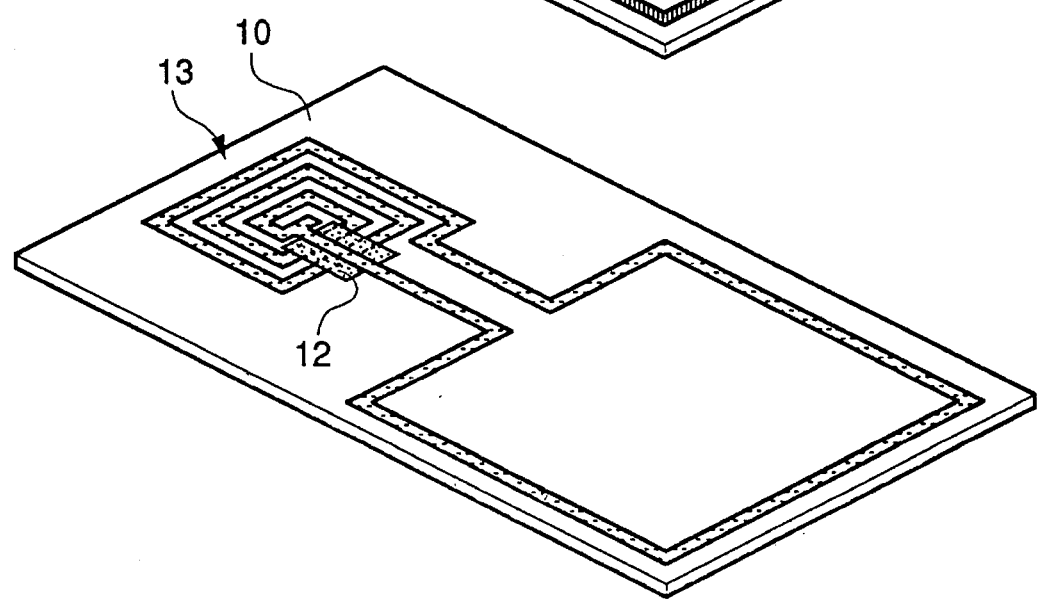
Figure 6:
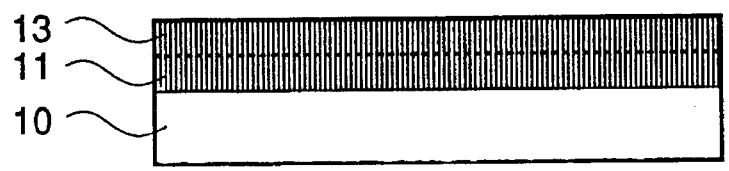
FIG. 6 is a sectional view showing the layer construction of the flux transformer of the present invention.

After the serial production processes mentioned above, the oxide superconducting flux transformer shown in FIG. 4C is completed. As shown in FIG. 6, in this flux transformer, the first oxide superconducting thin film 11 and the second oxide superconducting thin film 13 are piled up directly atop each other except the domain where the bridge part 4a exists, the layer constructions shown in FIG. 3A, 3B and 3C are formed.

In the manufacturing process of this flux transformer according to the invention, the support layer for the second oxide superconducting thin film 13 at its deposition is mostly the first oxide superconducting thin film 11. Accordingly, the quality of the second oxide superconducting thin film 13 does not deteriorate.

Further, the domain of the first oxide superconducting thin film covered by the non-superconducting thin film is small.

Furthermore, all the thin films can be patterned by photolithography technology. Accordingly, a minute pattern less than 20 μm can be formed.

In the above descriptions, the superconducting thin film has been labeled "the first" and "the second" in accordance with the fabrication sequence described above. But, with a process having a sequential order of the second oxide superconducting thin film, non-superconducting thin film and the first oxide superconducting thin film, substantially the same flux transformer can be produced. Thus, the examples herein should be understood to apply to such interchange of first and second oxide superconducting thin film.

EXAMPLE 1

A single crystal substrate of MgO(100) that has dimensions of 20 mm×20 mm was used as a substrate.

At first, thin film of $YBa_2Cu_3O_{7-x}$ have a thickness of 300 nm was deposited on the substrate by a laser deposition method. This thin film of $YBa_2Cu_3O_{7-x}$ was patterned by an Ar ion milling method using a photo-resist mask. The pattern of this thin film of $YBa_2Cu_3O_{7-x}$ corresponds to the pattern of the first oxide superconducting thin film 11 shown in FIG. 4A. As a result, the first oxide superconducting thin film, an element of the flux transformer of the present invention, was formed.

Subsequently, a thin film of $SrTiO_3$ having a thickness of 100 nm was deposited on the surface of the substrate and the first superconducting thin film by laser deposition method. This thin film of $SrTiO_3$ was patterned by an Ar ion milling method using a photo-resist mask. The pattern of the thin film of $SrTiO_3$ corresponds to the pattern of the non-superconducting thin film 12 shown in FIG. 4B. As a result, the non-superconducting thin film, an element of the flux transformer of the present invention, was formed.

Next, the top surface of the thin film of $YBa_2Cu_3O_{7-x}$ was removed to a thickness of 100 nm by an Ar ion milling method.

Subsequently, a thin film of $YBa_2Cu_3O_{7-x}$ having a thickness 200 nm was deposited by laser deposition method. This thin film of $YBa_2Cu_3O_{7-x}$ was patterned by an Ar ion milling method using a photo-resist mask. The pattern of this thin film of $YBa_2Cu_3O_{7-x}$ corresponds to the pattern of the second oxide superconducting thin film 13 shown in FIG. 5. As a result, the second superconducting thin film, an element of the flux transformer of the present invention was formed.

The specification of the flux transformer produced by the above-described method is given below. Concerning the input coil, the width of the lines are 80 μm, the spacing between the lines are 20 μm and the number of turns is 5. Concerning the pickup coil, the width of the lines are 2 mm and its shape is a square having sides with a length of 14 mm.

This flux transformer was made to couple with a SQUID formed of a thin film of $YBa_2Cu_3O_{7-x}$, and was cooled off by liquid nitrogen. As a result, it is identified that this flux transformer worked at 77K.

EXAMPLE 2

A single crystal substrate of MgO(100) that has dimensions of 20 mm×20 mm was used as a substrate.

At first, thin film of $YBa_2Cu_3O_{7-x}$ having a thickness of 300 nm was deposited on the substrate by a laser deposition method. This thin film of $YBa_2Cu_3O_{7-x}$ was patterned by an Ar ion milling method using a photo-resist mask. The pattern of this thin film of $YBa_2Cu_3O_{7-x}$ corresponds to the pattern of the first oxide superconducting thin film 11 shown in FIG. 4A. As a result, the first oxide superconducting thin film, an element of the flux transformer of the present invention, was formed.

Subsequently, a thin film of $SrTiO_3$ having a thickness of 150 nm was deposited on the surface of the substrate and the first superconducting thin film by laser deposition method. This thin film of $SrTiO_3$ was patterned by an Ar ion milling method using a photo-resist mask. The pattern of the thin film of $SrTiO_3$ corresponds to the pattern of the non-superconducting thin film 12 shown in FIG. 4B. As a result, the non-superconducting thin film, an element of the flux transformer of the present invention, was formed.

Next, the top surface of the thin film of $YBa_2Cu_3O_{7-x}$ was removed to a thickness of 100 nm by an Ar ion milling method.

Subsequently, a thin film of $YBa_2Cu_3O_{7-x}$ having a thickness 200 nm was deposited by laser deposition method. This thin film of $YBa_2Cu_3O_{7-x}$ was patterned by an Ar ion milling method using a photo-resist mask. The pattern of this thin film of $YBa_2Cu_3O_{7-x}$ corresponds to the pattern of the second oxide superconducting thin film 13 shown in FIG. 5. As a result, the second superconducting thin film, an element of the flux transformer of the present invention was formed.

The specification of the flux transformer produced by the above-described method is given below. Concerning the input coil, the width of the lines are 20 μm, the spacing between the lines are 10 μm and number of turns is 20. Concerning the pickup coil, the width of the lines are 2 mm and its shape is a square having sides with a length of 15 mm.

This flux transformer was made to couple with a SQUID formed of a thin film of $YBa_2Cu_3O_{7-x}$, and was cooled off by liquid nitrogen. As a result, it was identified that this flux transformer worked at 77K.

EXAMPLE 3

A single crystal substrate of $SrTiO_3$ (100) that has dimensions of 20 mm×20 mm was used as a substrate.

At first, thin film of $YBa_2Cu_3O_{7-x}$ having a thickness of 300 nm was deposited on the substrate by a laser deposition method. This thin film of $YBa_2Cu_3O_{7-x}$ was patterned by an Ar ion milling method using a photo-resist mask. The pattern of this thin film of $YBa_2Cu_3O_{7-x}$ corresponds to the pattern of the first oxide superconducting thin film 11 shown in FIG. 4A. As a result, the first oxide superconducting thin film, an element of the flux transformer of the present invention, was formed.

Subsequently, a thin film of $SrTiO_3$ having a thickness of 150 nm was deposited on the surface of the substrate and the first superconducting thin film by laser deposition method. This thin film of $SrTiO_3$ was patterned by an Ar ion milling method using a photo-resist mask. The pattern of the thin film of $SrTiO_3$ corresponds to the pattern of the non-superconducting thin film 12 shown in FIG. 4B. As a result, the non-superconducting thin film, an element of the flux transformer of the present invention, was formed.

Next, the top surface of the thin film of $YBa_2Cu_3O_{7-x}$ was removed to a thickness of 100 nm by an Ar ion milling method.

Subsequently, a thin film of $YBa_2Cu_3O_{7-x}$ having a thickness 200 nm was deposited by laser deposition method. This thin film of $YBa_2Cu_3O_{7-x}$ was patterned by an Ar ion milling method using a photo-resist mask. The pattern of this thin film of $YBa_2Cu_3O_{7-x}$ corresponds to the pattern of the second oxide superconducting thin film 13 shown in FIG. 5. As a result, the second superconducting thin film, an element of the flux transformer of the present invention was formed.

The specification of the flux transformer produced by the above-described method is given below. Concerning the input coil, the width of the lines are 20 μm, the spacing between the lines are 10 μm and number of turns is 20. Concerning the pickup coil, the width of the lines are 2 mm and its shape is a square having sides with a length of 15 mm.

This flux transformer was made to couple with a SQUID formed of a thin film of $YBa_2Cu_3O_{7-x}$, and was cooled off by liquid nitrogen. As a result, it was identified that this flux transformer worked at 77K.

Additional advantages and modifications will readily occur to those skilled in the art. Therefore, the invention is its broader aspects is not limited to the specific details, and representative devices, shown and described herein. Accordingly, various modifications may be made without departing from the spirit or scope of the general inventive concept as defined by the appended claims and their equivalents.

We claim:

1. An oxide superconducting flux transformer comprising: a pickup coil, an input coil, a first line connecting a first end of the input coil to a first end of the pickup coil and a second line including a bridge part connecting a second end of the pickup coil to a second end of the input coil; wherein the input coil, the pickup coil, the first line and the second line are constructed from a first oxide superconducting thin film having a pattern which corresponds to the second line except the bridge part, the first line, the pickup coil and the input coil, a second oxide superconducting thin film having a pattern which corresponds to the input coil except a domain which is intersected by the bridge part, the pickup coil, the first line and the second line and a non-superconducting thin film formed in the domain in which the bridge part exists, between the first and the second oxide superconducting thin films, and the second oxide superconducting thin film formed directly atop the first oxide superconducting thin film in all domains, except for the domain in which the bridge part exists.

2. The oxide superconducting flux transformer according to claim 1, wherein the first and the second oxide superconducting thin films have a same composition and a same crystal structure.

3. The oxide superconducting flux transformer according to claim 1, wherein the non-superconducting thin film and the substrate are formed of a same material as a material of the substrate.

4. A method for producing an oxide superconducting flux transformer having a pickup coil, an input coil, a first line connecting a first end of the input coil to a first end of the pickup coil and a second line including a bridge part connecting a second end of the pickup coil to a second end of the input coil, said method comprising the steps of:

forming a first oxide superconducting thin film on a substrate having a pattern which corresponds to the second line except the bridge part, the first line, the pickup coil and the input coil;

forming a non-superconducting thin film in a domain which includes the bridge part; and forming a second oxide superconducting thin film having a pattern which corresponds to the input coil except a domain which is intersected by the bridge part, the pickup coil, the first line and the second line.

5. The method according to claim 4, further comprising the step of removing a top surface layer of the first oxide superconducting thin film, after patterning the non-superconducting thin film and before forming the second oxide superconducting thin film.

6. A method for producing an oxide superconducting flux transformer having a pickup coil, an input coil, a first line connecting a first end of the input coil to a first end of the pickup coil and a second line including a bridge part connecting from a second end of the pickup coil to a second end of the input coil, said method comprising the steps of;

forming a first oxide superconducting thin film on a substrate having a pattern which corresponds to the input coil except a domain which is intersected by the bridge part of the line, the pickup coil, the first line and the second line;

forming a non-superconducting thin film in a domain which includes the bridge part; and forming a second oxide superconducting thin film having a pattern which corresponds to the second line except the bridge part, the first line, the pickup coil and the input coil.

7. The method according to claim 6, further comprising the step of removing a top surface layer of the first oxide superconducting thin film, after patterning the non-superconducting thin film and before forming the second oxide superconducting thin film.

\* \* \* \* \*